(12) United States Patent
Kaur et al.

(10) Patent No.: US 11,940,731 B2
(45) Date of Patent: Mar. 26, 2024

(54) PHOTORESIST TOPCOAT COMPOSITIONS AND METHODS OF PROCESSING PHOTORESIST COMPOSITIONS

(71) Applicant: Rohm and Haas Electronic Materials LLC, Marlborough, MA (US)

(72) Inventors: Irvinder Kaur, Northborough, MA (US); Cong Liu, Shrewsbury, MA (US); Doris Kang, Shrewsbury, MA (US); Chunyi Wu, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 795 days.

(21) Appl. No.: 16/449,955

(22) Filed: Jun. 24, 2019

(65) Prior Publication Data
US 2020/0004152 A1 Jan. 2, 2020

Related U.S. Application Data

(60) Provisional application No. 62/692,746, filed on Jun. 30, 2018.

(51) Int. Cl.
| | | |
|---|---|---|
| *G03F 7/11* | (2006.01) | |
| *C09D 133/14* | (2006.01) | |
| *C09D 133/16* | (2006.01) | |
| *C08F 220/28* | (2006.01) | |
| *C08F 220/38* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC .............. *G03F 7/11* (2013.01); *C09D 133/14* (2013.01); *C09D 133/16* (2013.01); *C08F 220/281* (2020.02); *C08F 220/283* (2020.02); *C08F 220/382* (2020.02); *C08F 220/387* (2020.02); *G03F 7/162* (2013.01); *G03F 7/168* (2013.01); *G03F 7/2041* (2013.01); *G03F 7/322* (2013.01); *G03F 7/38* (2013.01)

(58) Field of Classification Search
CPC ... G03F 7/09; G03F 7/092; G03F 7/11; G03F 7/2041; C09D 133/16; C09D 133/14
See application file for complete search history.

(56) References Cited

U.S. PATENT DOCUMENTS

| 9,122,159 B2 | 9/2015 | Wang et al. |
|---|---|---|
| 9,261,789 B2 | 2/2016 | Hayama et al. |
| 9,298,093 B2 | 3/2016 | Bae et al. |
| 9,581,904 B2 | 2/2017 | Lee et al. |
| 10,578,969 B2 | 3/2020 | Liu et al. |
| 2007/0212646 A1 | 9/2007 | Gallagher et al. |
| 2010/0183976 A1 | 7/2010 | Wang et al. |
| 2011/0123925 A1* | 5/2011 | Yun ........................ C08F 220/24 524/544 |
| 2013/0084524 A1 | 4/2013 | Hayama et al. |
| 2014/0093826 A1 | 4/2014 | Minegishi et al. |
| 2016/0122574 A1 | 5/2016 | Lee et al. |
| 2016/0122674 A1 | 5/2016 | White |
| 2016/0124309 A1 | 5/2016 | Lee et al. |
| 2016/0130462 A1 | 5/2016 | Liu et al. |

OTHER PUBLICATIONS

Sanders, et al., "Self-segregating materials for immersion lithography", Advances in Resist Materials and Processing Technology XXV, Proceedings of the SPIE, 2008, pp. 692309-1-692309-12, vol. 6923.

(Continued)

*Primary Examiner* — Daborah Chacko-Davis
(74) *Attorney, Agent, or Firm* — Jonathan D. Baskin

(57) ABSTRACT

Photoresist topcoat compositions comprise: a matrix polymer and a surface active polymer, wherein the surface active polymer comprises polymerized units of the following general formula (I):

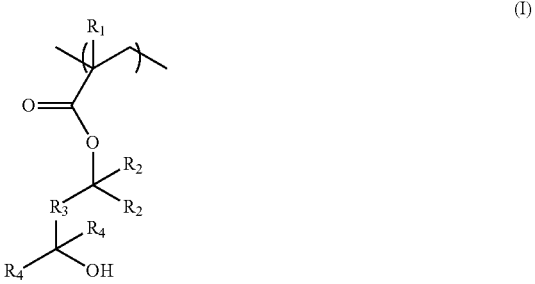

wherein: $R_1$ represents a hydrogen atom, a halogen atom, a C1-C4 alkyl group, or a C1-C4 haloalkyl group; $R_2$ independently represents a hydrogen atom or an optionally substituted alkyl group, wherein at least one $R_2$ is not a hydrogen atom, wherein the $R_2$ groups taken together optionally form a cyclic structure, and wherein the total number of carbon atoms for the $R_2$ groups taken together is from 2 to 20; $R_3$ represents an optionally substituted C1-C4 alkylene group, wherein an $R_2$ group optionally forms a cyclic structure with $R_3$; and $R_4$ independently represents C1-C4 fluoroalkyl groups; wherein the total polymerized units of general formula (I) are present in the surface active polymer in an amount of 95 wt % or more based on total polymerized units of the surface active polymer; and wherein the surface active polymer is present in the composition in an amount of from 0.1 to 30 wt % based on total solids of the composition; and an organic-based solvent system comprising a plurality of organic solvents. The invention finds particular applicability in the manufacture of semiconductor devices.

16 Claims, No Drawings

(56) References Cited

OTHER PUBLICATIONS

Search report for corresponding Taiwan Application No. 108123089 dated Feb. 25, 2020.
Search report for corresponding Chinese Application No. CN201910583165.9 dated Oct. 4, 2022.

* cited by examiner

PHOTORESIST TOPCOAT COMPOSITIONS AND METHODS OF PROCESSING PHOTORESIST COMPOSITIONS

FIELD OF THE INVENTION

This invention relates to photoresist topcoat compositions that may be applied above a photoresist composition. The invention finds particular applicability as a topcoat layer in an immersion lithography process for the formation of semiconductor devices.

BACKGROUND OF THE INVENTION

Photoresists are used for transferring an image to a substrate. A layer of a photoresist is formed on a substrate and the photoresist layer is then exposed through a photomask to a source of activating radiation. The photomask has areas that are opaque to the activating radiation and other areas that are transparent to the activating radiation. Exposure to activating radiation provides a photoinduced chemical transformation of the photoresist coating to thereby transfer the pattern of the photomask to the photoresist-coated substrate. Following exposure, the photoresist is baked and developed by contact with a developer solution to provide a relief image that permits selective processing of the substrate.

One approach to achieving nanometer (nm)-scale feature sizes in semiconductor devices is to use shorter wavelengths of light. However, the difficulty in finding materials that are transparent below 193 nm has led to the immersion lithography process to increase the numerical aperture of the lens by use of a liquid to focus more light into the film. Immersion lithography employs a relatively high refractive index fluid, typically water, between the last surface of an imaging device (e.g., ArF light source) and the first surface on the substrate, for example, a semiconductor wafer.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to address this problem, photoresist topcoat layers have been introduced as a barrier layer between the immersion fluid and underlying photoresist layer.

Topcoats exhibiting a low receding contact angle (RCA) for a given scan speed can result in water mark defects. These defects are generated when water droplets are left behind as the exposure head moves across the wafer. As a result, resist sensitivity becomes altered due to leaching of resist components into the water droplets, and water can permeate into the underlying resist. The use of self-segregating topcoat compositions has been proposed, for example, in *Self-segregating Materials for Immersion Lithography*, Daniel P. Sanders et al., Advances in Resist Materials and Processing Technology XXV, Proceedings of the SPIE, Vol. 6923, pp. 692309-1-692309-12 (2008), and in U.S. Patent App. Pub. Nos. 2007/0212646A1 to Gallagher et al. and 2010/0183976A1 to Wang et al. A self-segregated topcoat would theoretically allow for a tailored material having desired properties at both the immersion fluid and photoresist interfaces, for example, an increased water receding contact angle at the immersion fluid interface, and good developer solubility at the photoresist interface.

Increases in receding contact angle can be achieved by use of topcoat materials having increased hydrophobicity at the immersion fluid interface, typically achieved through the use of a fluorinated polymer. In addition to allowing for reductions in water mark defects, increasing topcoat receding contact angle generally enables the use of an increased scan speed, resulting in greater process throughput. Despite such positive effects, the use of highly hydrophobic materials may negatively impact other defect types, for example, coating and patterning defects. Such defects can prevent proper formation of resist patterns and pattern transfer to underlying layers, thereby negatively impacting device yield. These defects may take the form, for example, of one or more of micro-bridging, missing contact holes, line pinching, or CD shift. A topcoat layer having a balance of high receding contact angle and low coating and patterning defectivity levels would therefore be desired.

There is a continuing need in the art for improved photoresist topcoat compositions and photolithographic methods making use of such materials which address one or more problems associated with the state of the art.

SUMMARY OF THE INVENTION

In accordance with a first aspect of the invention, provided are photoresist topcoat compositions. The compositions comprise: a matrix polymer and a surface active polymer, wherein the surface active polymer comprises polymerized units of the following general formula (I):

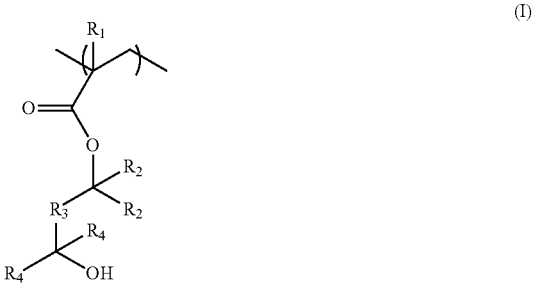

wherein: $R_1$ represents a hydrogen atom, a halogen atom, a C1-C4 alkyl group, or a C1-C4 haloalkyl group; $R_2$ independently represents a hydrogen atom or an optionally substituted alkyl group, wherein at least one $R_2$ is not a hydrogen atom, wherein the $R_2$ groups taken together optionally form a cyclic structure, and wherein the total number of carbon atoms for the $R_2$ groups taken together is from 2 to 20; $R_3$ represents an optionally substituted C1-C4 alkylene group, wherein an $R_2$ group optionally forms a cyclic structure with $R_3$; and $R_4$ independently represents C1-C4 fluoroalkyl groups; wherein the total polymerized units of general formula (I) are present in the surface active polymer in an amount of 95 wt % or more based on total polymerized units of the surface active polymer; and wherein the surface active polymer is present in the composition in an amount of from 0.1 to 30 wt % based on total solids of the composition; and an organic-based solvent system comprising a plurality of organic solvents.

In accordance with a further aspect of the invention, provided are coated substrates. The coated substrates comprise: a coated substrate, comprising: a photoresist layer on a substrate; and a topcoat layer formed from a photoresist topcoat composition as described herein on the photoresist layer.

In accordance with a further aspect of the invention, provided are methods of processing a photoresist composition. The methods comprise: (a) applying a photoresist composition over a substrate to form a photoresist layer; (b) applying over the photoresist layer a photoresist topcoat composition as described herein to form a topcoat layer; (c) exposing the topcoat layer and the photoresist layer to activating radiation; and (d) contacting the exposed topcoat layer and photoresist layer with a developer to form a resist pattern.

Except as otherwise specified, "substituted" as used herein shall be understood to mean having one or more hydrogen atoms replaced with one or more substituents chosen, for example, from hydroxy, halogen (i.e., F, Cl, Br, I), or a combination thereof. The articles "a" and "an" are inclusive of one or more unless otherwise indicated.

DETAILED DESCRIPTION

Topcoat Compositions

The topcoat compositions of the invention comprise a matrix polymer, a surface active polymer and a solvent mixture, and can include one or more additional, optional components. Preferred topcoat compositions of the invention that are applied above a photoresist layer can minimize or prevent migration of components of the photoresist layer into an immersion fluid employed in an immersion lithography process. In preferred topcoat compositions of the invention, the surface active polymer is self-segregating. As used herein, the term "immersion fluid" means a fluid, typically water, interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

Preferred topcoat compositions of the invention can allow for improvement in defectivity characteristics, for example, coating defectivity and/or pattern defectivity. In addition, topcoat compositions of the invention can exhibit favorable contact angle characteristics, for example, receding contact angle (RCA), a characteristic at the immersion fluid interface that is important in an immersion lithography process in allowing for high scan speeds which translates to greater process throughput. The topcoat compositions provide topcoat layers having excellent developer solubility for both exposed and unexposed regions of the layer, for example, in an aqueous base developer. The compositions can be used in dry lithography or more typically in immersion lithography processes. The exposure wavelength is not particularly limited except by the photoresist compositions, with wavelengths of less than 300 nm, for example, 248 nm, 193 nm or an EUV wavelength (e.g., 13.4 nm) being typical. Use of the compositions in a 193 nm immersion lithography process is particularly preferred.

Polymers useful in the invention are aqueous alkali soluble such that a topcoat layer formed from the composition can be removed in the resist development step using an aqueous alkaline developer, for example, a quaternary ammonium hydroxide solution, for example, tetra methyl ammonium hydroxide (TMAH), typically 0.26 N aqueous TMAH. The different polymers suitably may be present in varying relative amounts.

A variety of polymers may be employed in the topcoat compositions of the invention, including polymers comprising polymerized acrylate groups, polyesters, or other repeat units and/or polymer backbone structures such as provided by, for example, poly(alkylene oxide), poly(meth)acrylic acid, poly (meth)acrylamides, polymerized aromatic (meth)acrylates, and polymerized vinyl aromatic monomers. Typically, the polymers include at least two different repeat units. The different polymers suitably may be present in varying relative amounts.

The polymers of the topcoat compositions of the invention may contain a variety of repeat units, including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the polymers will depend, for example, on the intended functionality of the polymer.

In certain preferred aspects, one or more polymers of the coating composition will comprise one or more groups that are reactive during lithographic processing, for example, one or more photoacid-acid labile groups that can undergo cleavage reactions in the presence of acid and heat, such as acid-labile ester groups (e.g., t-butyl ester groups such as provided by polymerization of t-butyl acrylate or t-butyl-methacrylate, adamantylacrylate) and/or acetal groups such as provided by polymerization of a vinyl ether compound. The presence of such groups can render the associated polymer(s) more soluble in a developer solution, thereby aiding in developability and removal of the topcoat layer during a development process.

The polymers can advantageously be selected to tailor characteristics of the topcoat layer, with each generally serving one or more purpose or function. Such functions include, for example, one or more of photoresist profile adjusting, topcoat surface adjusting, reducing defects and reducing interfacial mixing between the topcoat and photoresist layers.

The polymers can advantageously be selected to tailor characteristics of the topcoat layer, with each generally serving one or more purpose or function. Such functions include, for example, one or more of photoresist profile adjusting, topcoat surface adjusting, reducing defects and reducing interfacial mixing between the topcoat and photoresist layers.

The topcoat compositions include one or more, preferably two or more with two being typical, matrix polymers that may include one or more different types of repeat units, with two or three different repeat units being typical. The matrix polymer should provide a sufficiently high developer dissolution rate for reducing overall defectivity due, for example, to micro-bridging.

The matrix polymer may include, for example, a sulfonamide-containing monomer for enhancing the polymer developer dissolution rate. A typical developer dissolution rate for the matrix polymer is greater than 300 nm/second, preferably greater than 500 nm/second. The matrix polymers can be fluorinated or non-fluorinated. For some photoresist materials, fluorinated topcoat matrix polymers can reduce or minimize interfacial mixing between the topcoat layer and underlying photoresist layer. Accordingly, one or more repeating unit of the matrix polymer can be fluorinated, for example, with a fluoroalkyl group such as a C1 to C4 fluoroalkyl group, typically fluoromethyl, and may be present, for example, as a sulfonamide group (e.g., —NHSO$_2$CF$_3$) or a fluoroalcohol group (e.g., —C(CF$_3$)$_2$OH).

The matrix polymer has a higher surface energy than that of, and is preferably immiscible with, the surface active polymer, to allow the surface active polymer to phase separate from the matrix polymer and migrate to the upper surface of the topcoat layer away from the topcoat photoresist interface. The surface energy of the matrix polymer is typically from 30 to 60 mN/m.

Exemplary matrix polymers in accordance with the invention include the following:

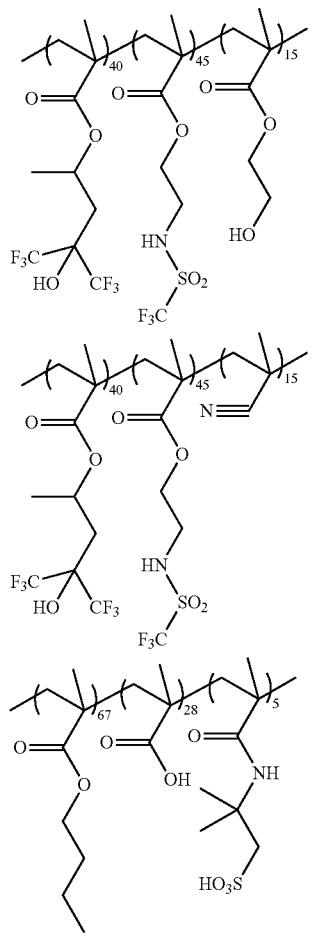

-continued

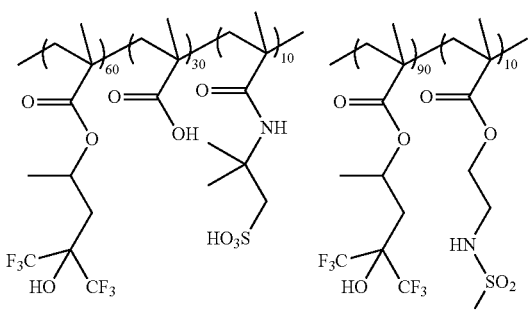

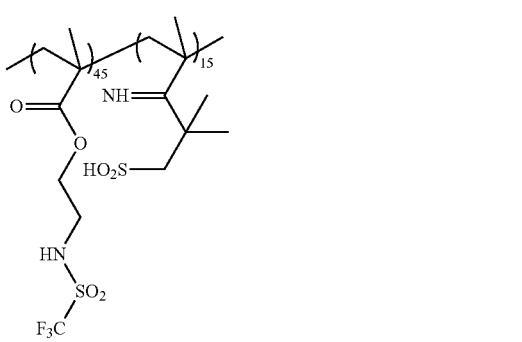

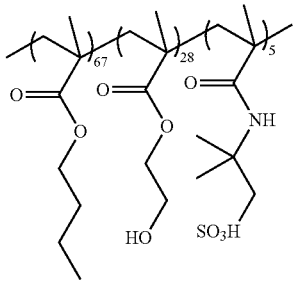

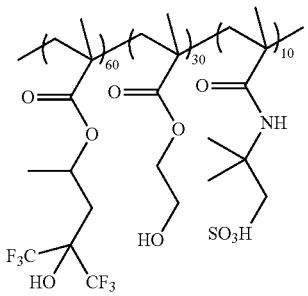

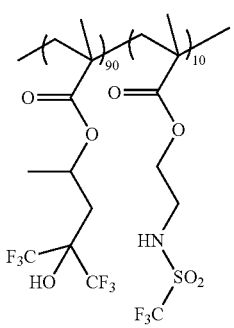

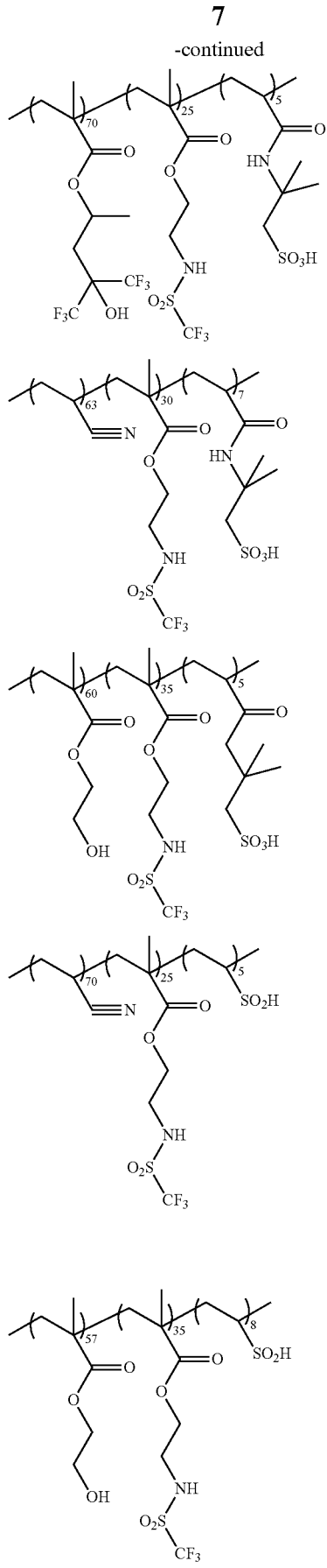

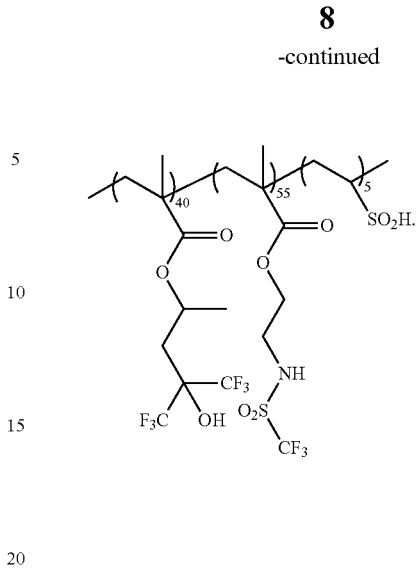

The one or more matrix polymers are typically present in the compositions in a combined amount of from 70 to 99.9 wt %, more typically from 85 to 95 wt %, based on total solids of the topcoat composition. The weight average molecular weight of the matrix polymer is typically less than 400,000, for example, from 5000 to 50,000, from 5000 to 15,000 or from 5000 to 25,000 Daltons.

The surface active polymer is provided in the topcoat compositions to provide beneficial surface properties at the topcoat/immersion fluid interface. In particular, the surface active polymer beneficially can provide desirable surface properties with respect to water, for example, one or more of improved static contact angle (SCA), receding contact angle (RCA), advancing contact angle (ACA) or sliding angle (SA) at the topcoat/immersion fluid interface. In particular, the surface active polymer can allow for a higher RCA, which can allow for faster scanning speeds and increased process throughput. A layer of the topcoat composition in a dried state typically has a water receding contact angle of from 60 to 90°, typically from 70 to 90°, from 75 to 85° or from 75 to 80°. The phrase "in a dried state" means containing 8 wt % or less of solvent, based on the entire composition.

The surface active polymer is preferably aqueous alkali soluble. The surface active polymer preferably has a lower surface energy than the matrix polymer. Preferably, the surface active polymer has a significantly lower surface energy than and is substantially immiscible with the matrix polymer, as well as any other polymers present in the topcoat composition. In this way, the topcoat composition can be self-segregating, wherein the surface active polymer migrates to the upper surface of the topcoat layer apart from other polymers during coating. The resulting topcoat layer is thereby rich in the surface active polymer at the topcoat layer upper surface which, in the case of an immersion lithography process is at the topcoat/immersion fluid interface. While the desired surface energy of the surface active polymer will depend on the particular matrix polymer and its surface energy, the surface active polymer surface energy is typically from 25 to 35 mN/m, preferably from 25 to 30 mN/m. The surface energy of the surface active polymer is typically from 5 to 25 mN/m less than that of the matrix polymer, preferably from 5 to 15 mN/m less than that of the matrix polymer.

The surface active polymer comprises polymerized units of the following general formula (I):

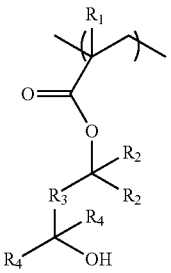
(I)

wherein: $R_1$ represents a hydrogen atom, a halogen atom, a C1-C4 alkyl group, or a C1-C4 haloalkyl group, with a hydrogen atom or methyl being typical; $R_2$ independently represents a hydrogen atom or an optionally substituted alkyl group, for example, C1-C10 linear, C3-C10 branched or C3-C10 cyclic (monocyclic or polycyclic, e.g., adamantyl or norbornyl) alkyl, with C3-10 branched or C3-C10 cyclic being preferred, wherein at least one $R_2$ is not a hydrogen atom, wherein the $R_2$ groups taken together optionally form a cyclic structure, and wherein the total number of carbon atoms for the $R_2$ groups taken together is from 2 to 20; $R_3$ represents an optionally substituted C1-C4 alkylene group, and an $R_2$ group optionally forms a cyclic structure with $R_3$; and $R_4$ independently represents a C1-C4 fluoroalkyl group, with trifluoromethyl being typical. If one of the $R_2$ groups is a hydrogen atom, the other $R_2$ group is preferably optionally substituted C3-C10 alkyl, with a branched or cyclic structure being preferred.

Suitable polymerized units of general formula (I) include, for example, the following:

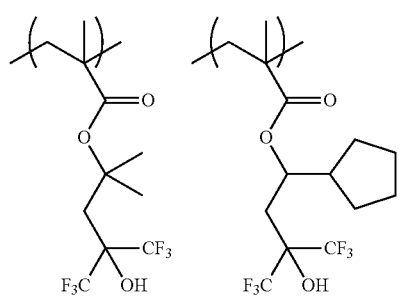

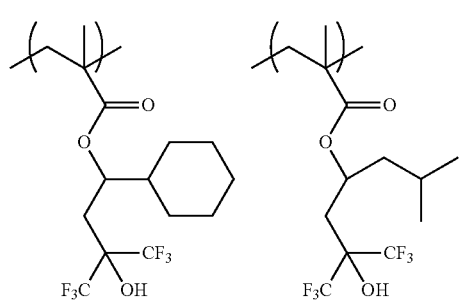

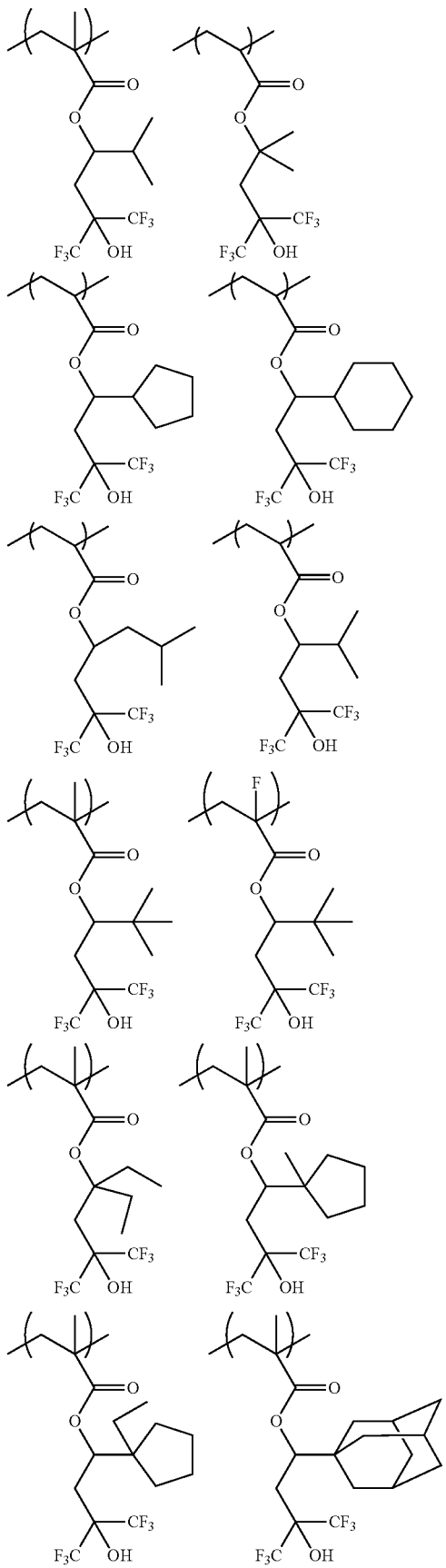

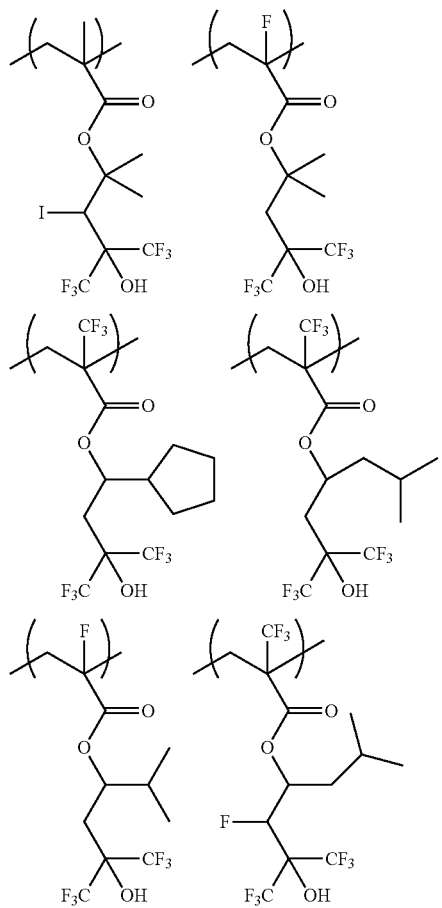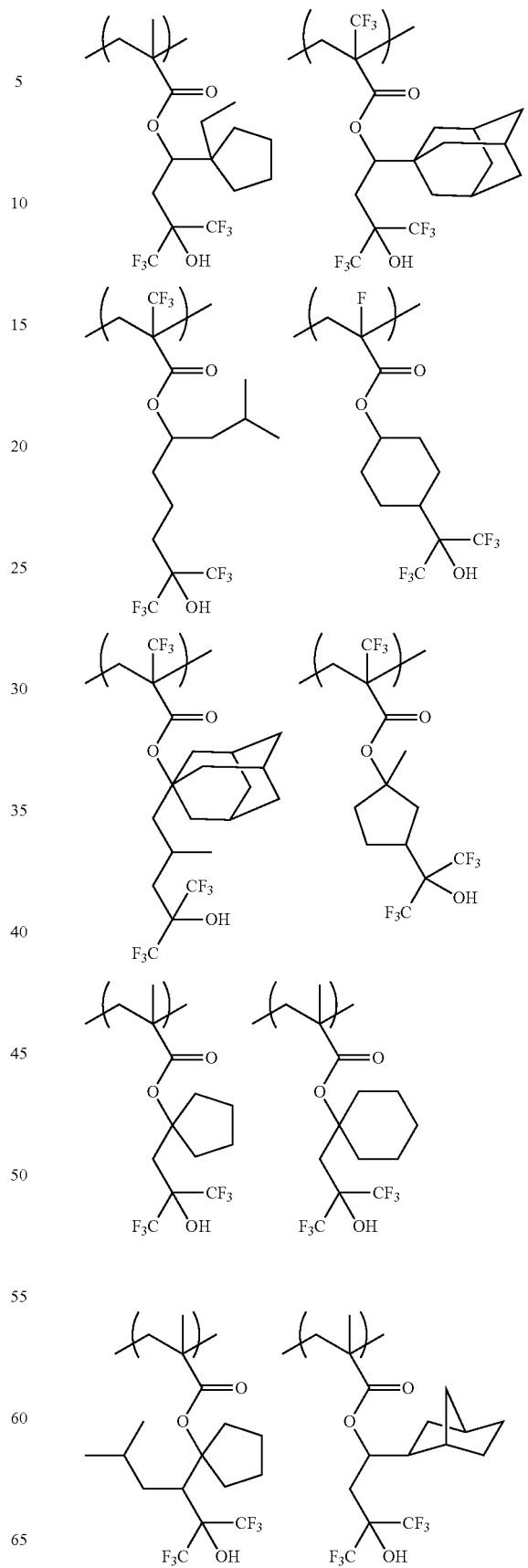

-continued

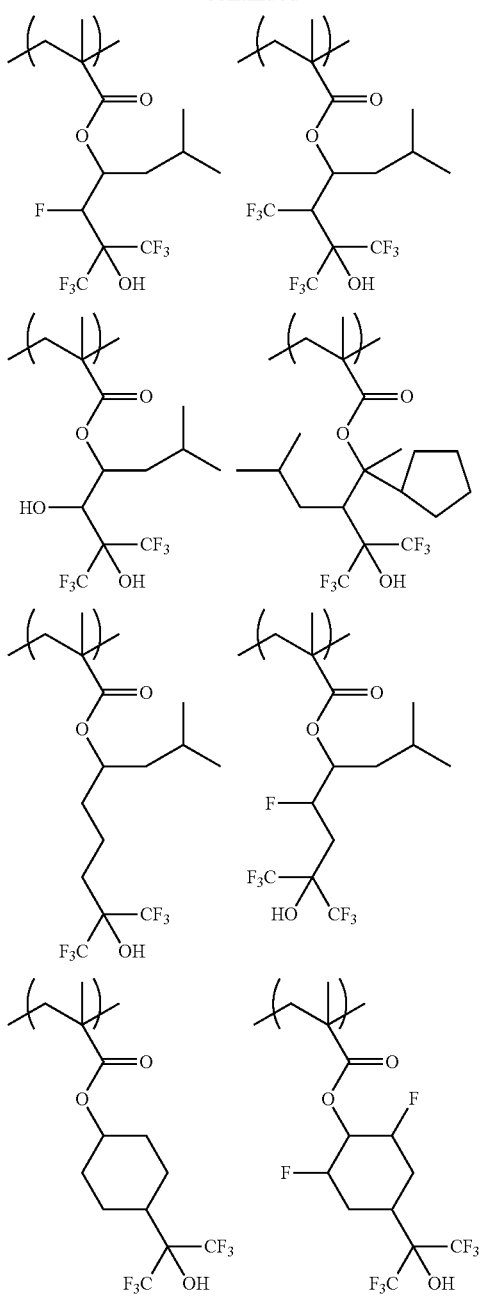
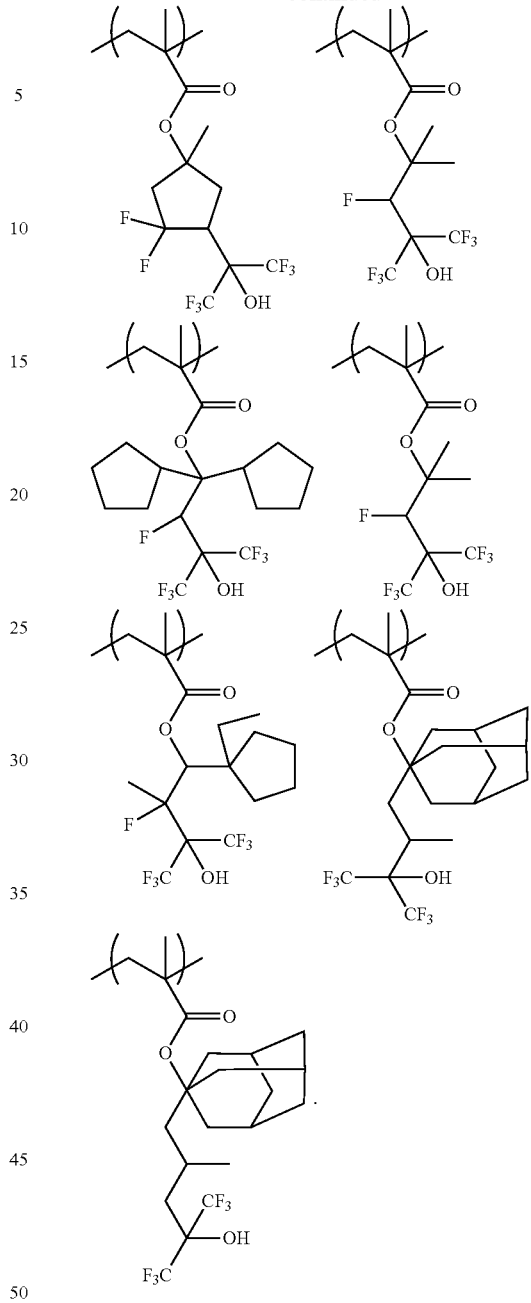
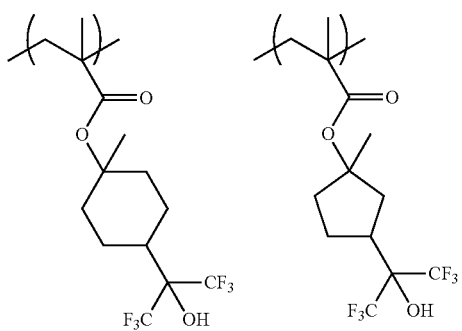

The surface active polymer is typically a homopolymer, but can be a copolymer comprising two or more distinct polymerized units of general formula (I). The surface active polymer can optionally include one, two or more additional unit types other than those of general formula (I). The total polymerized units of general formula (I) are present in the surface active polymer in an amount of 95 wt % or more, typically 98 wt % or more, 98 wt % or more, or 100 wt %, based on total polymerized units of the surface active polymer. Suitable polymerized units for the surface active polymer in addition to those of general formula (I) include, for example, those containing one or more group chosen from acid labile, base labile, sulfonamide, alkyl and ester groups. Preferably, such acid labile, base labile, sulfonamide, alkyl and ester groups are fluorinated.

Exemplary additional unit types for use in the surface active polymer in accordance with the invention include polymerized units of one or more of the following monomers:
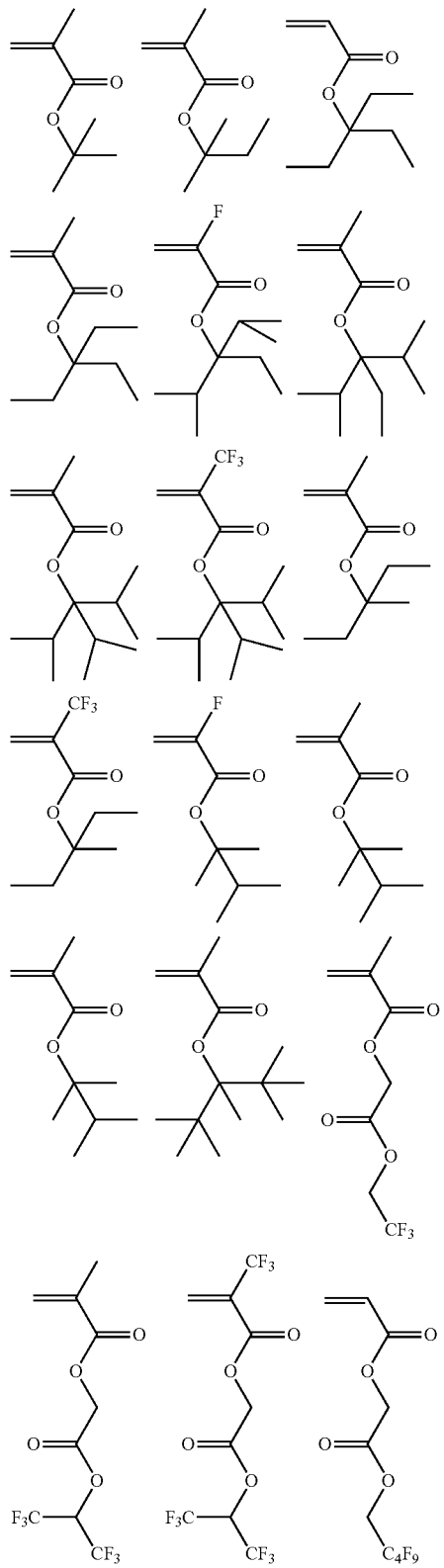
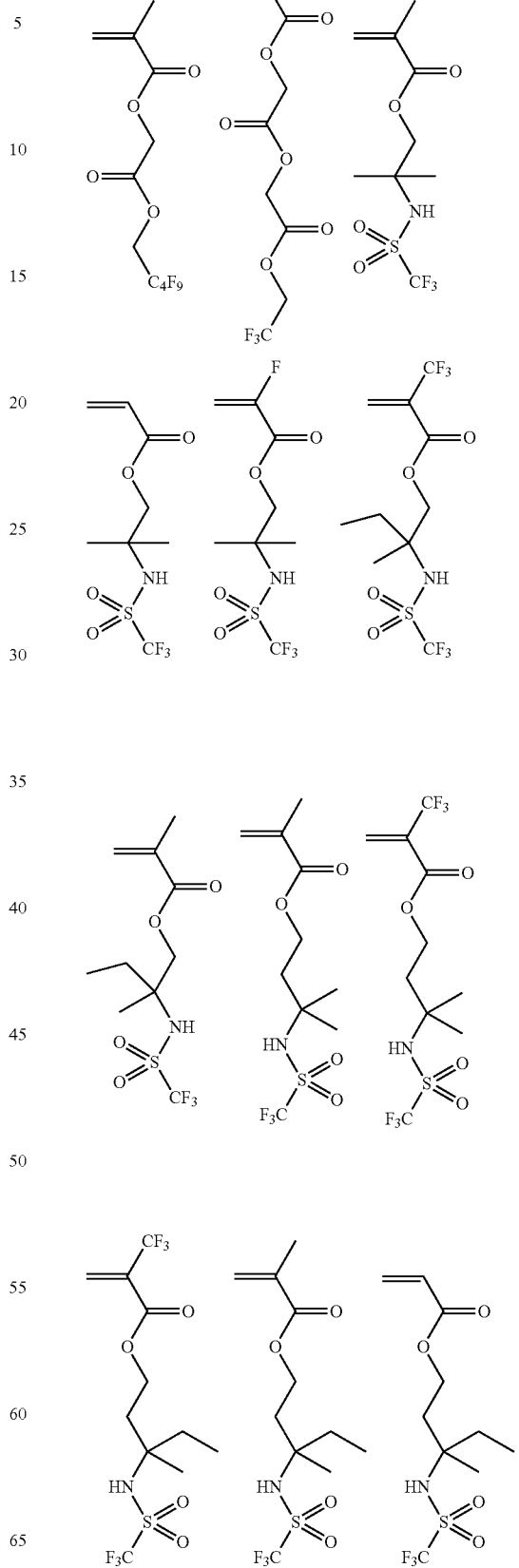

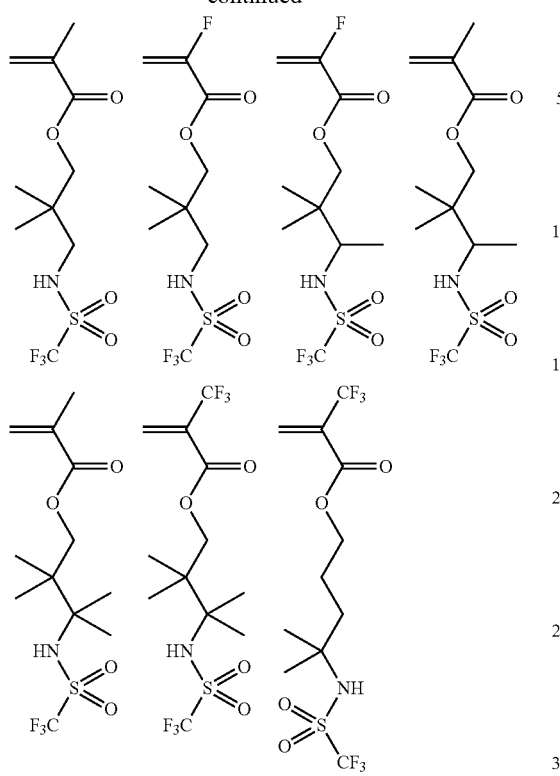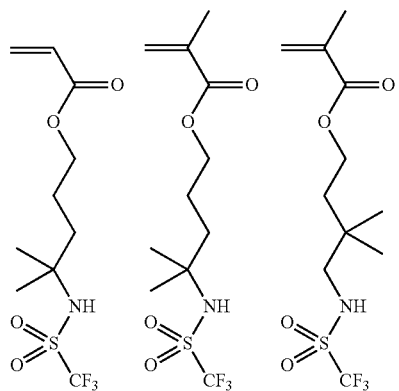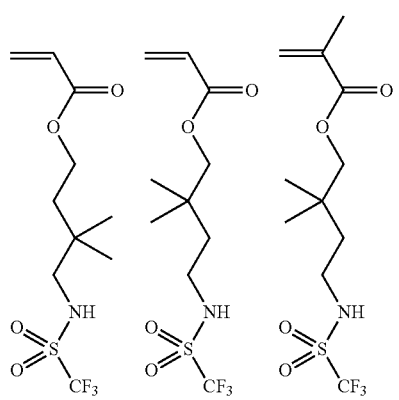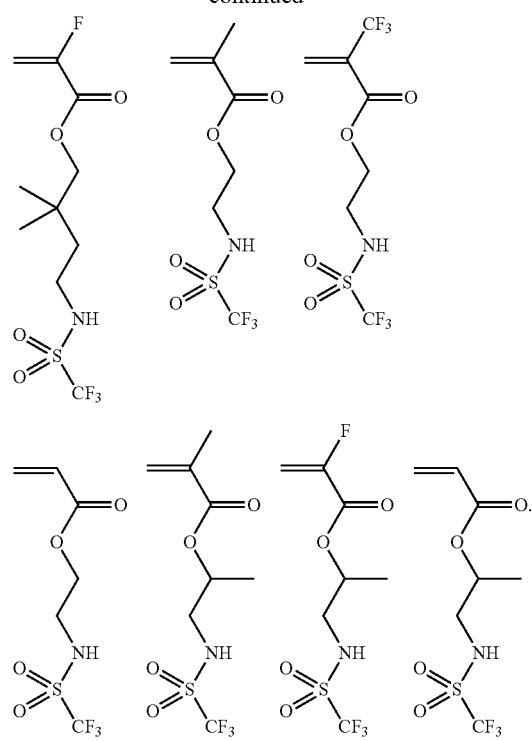
Exemplary polymers useful as the surface active polymer include, for example, homopolymers and copolymers of the above-described polymerized units of general formula (I), as well as the following polymers:
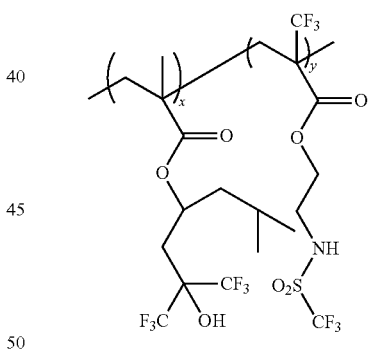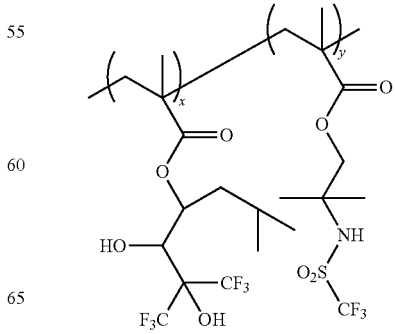

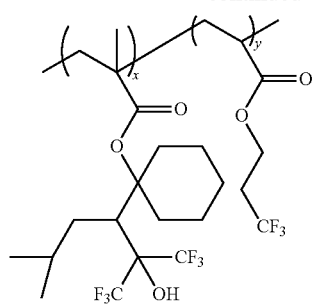
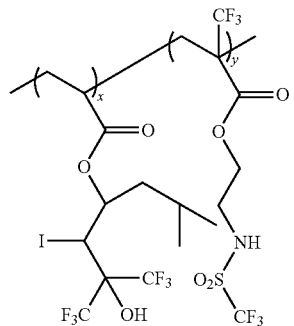
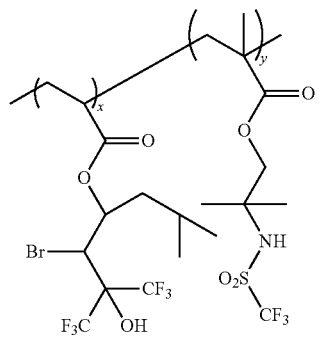
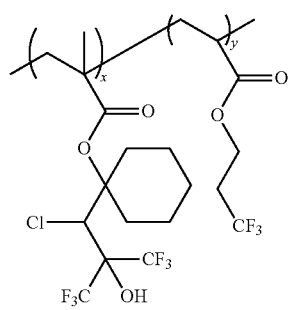
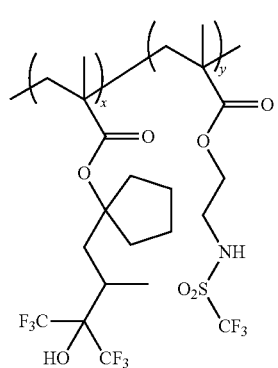
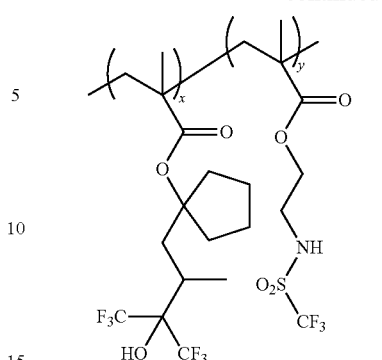
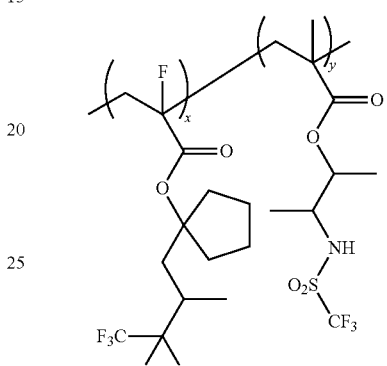
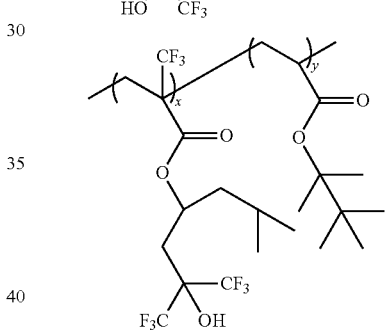
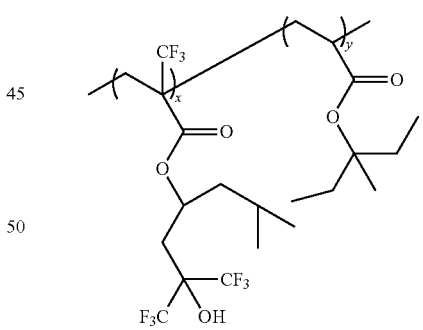
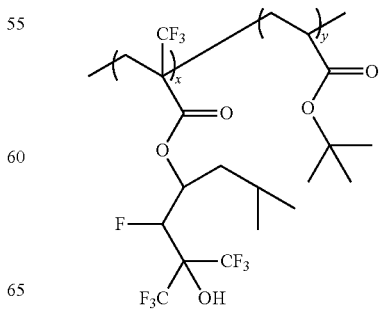

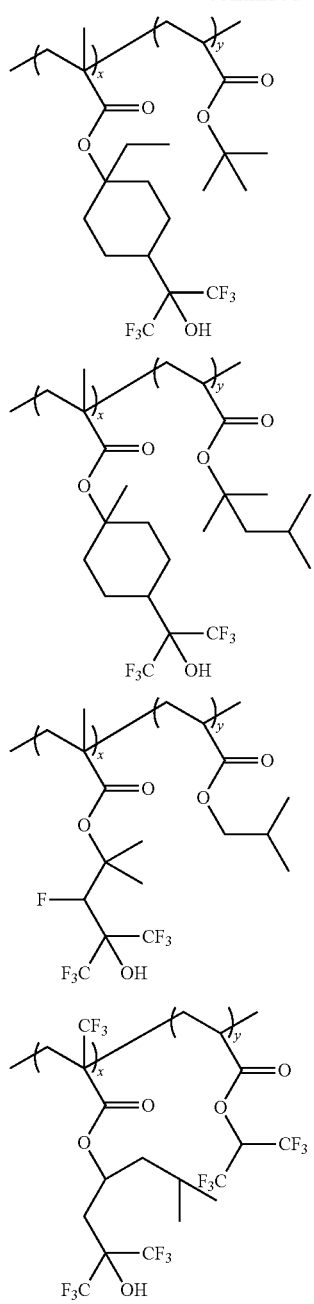
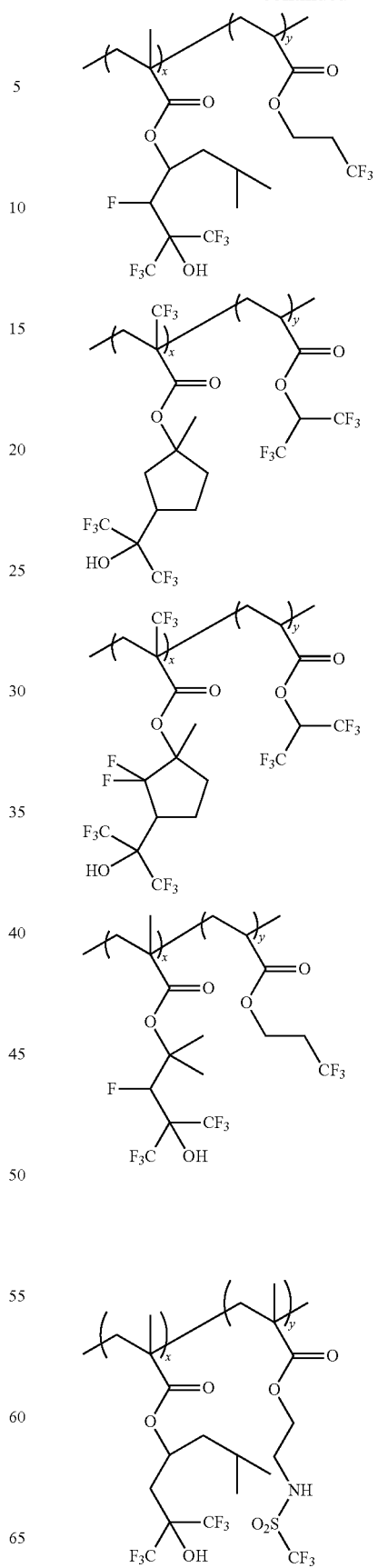

-continued
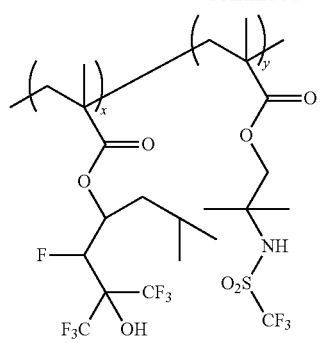
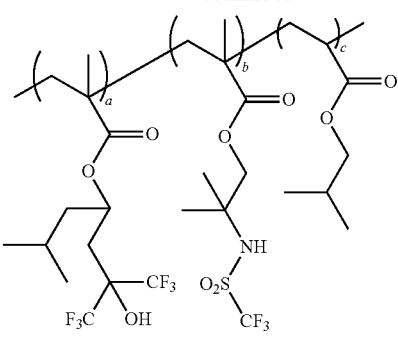
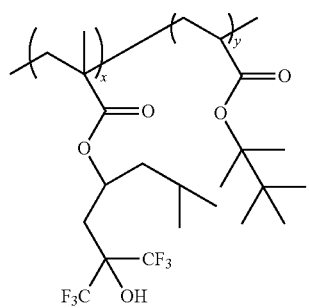
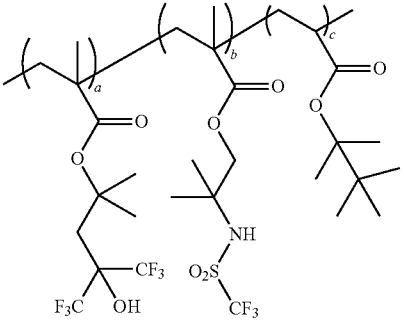
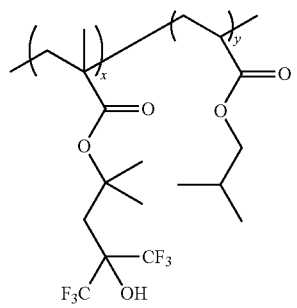
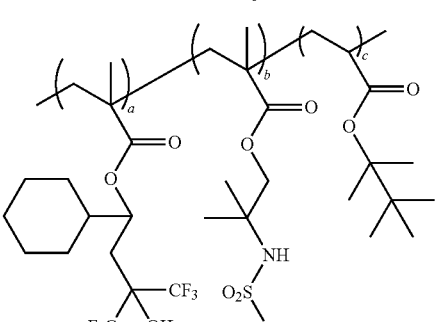
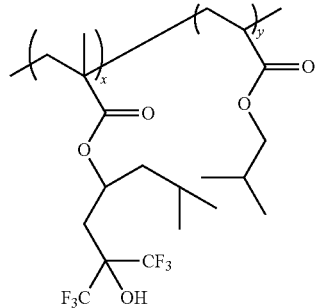
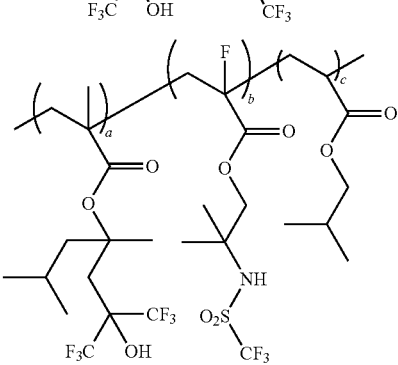
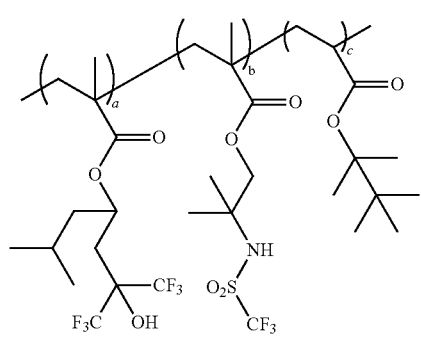
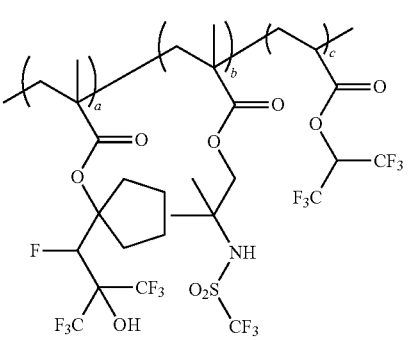

-continued

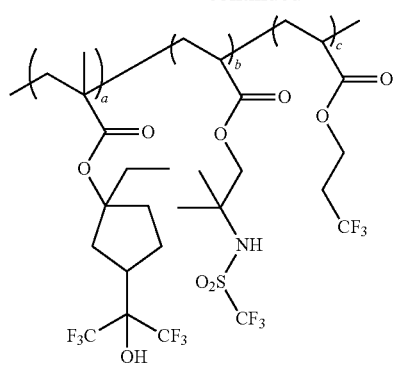
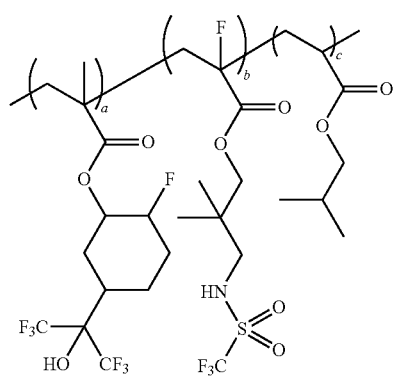
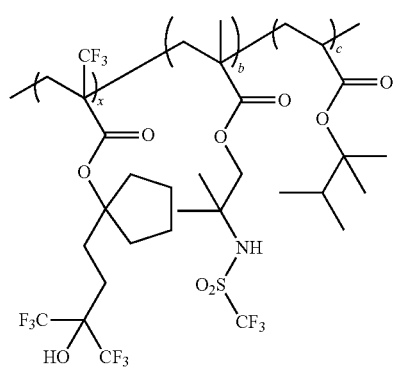
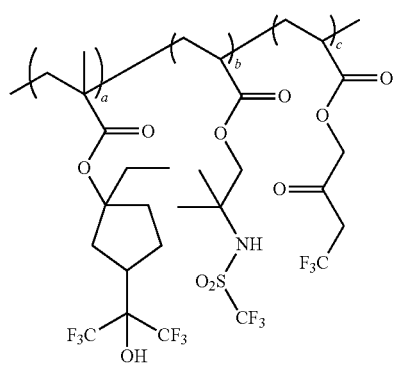

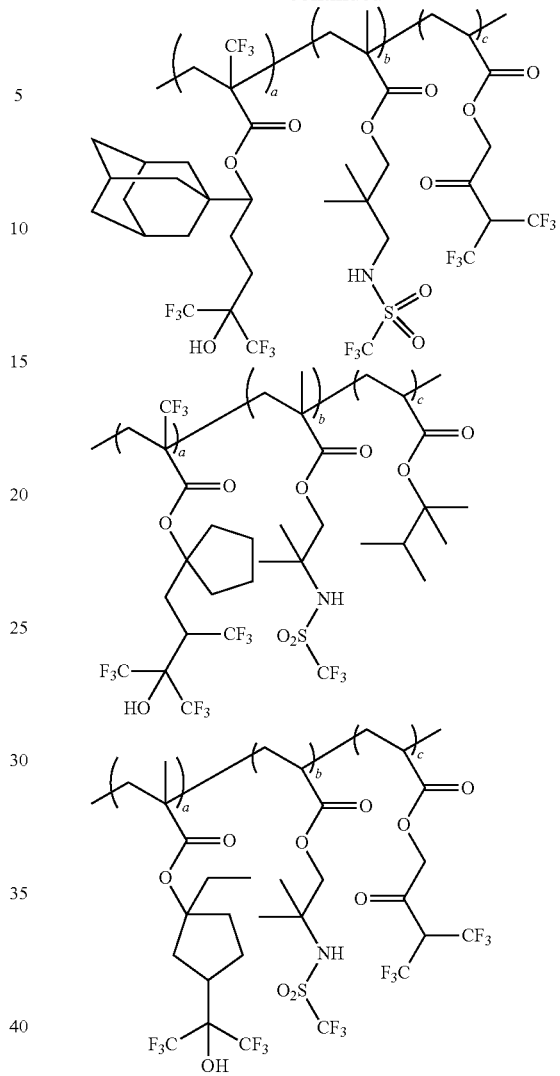

wherein x is 95 to 99 wt %, y is 1 to 5 wt %, a is 95 to 98 wt %, and b and c are each 1 to 4 wt %, wherein the sum of x and y is 100 wt %, and the sum of a, b and c is 100 wt %.

The surface active polymer lower limit for immersion lithography is generally dictated by the need to prevent leaching of the photoresist components. The surface active polymer is present in the compositions in an amount of from 0.1 to 30 wt %, more typically from 3 to 20 wt % or 5 to 15 wt %, based on total solids of the topcoat composition. The surface active polymer lower limit for immersion lithography is generally dictated by the need to prevent leaching of the photoresist components. The weight average molecular weight Mw of the additive polymer is typically less than 400,000, preferably from 5000 to 50,000, more preferably from 5000 to 25,000 Daltons.

Optional additional polymers can be present in the topcoat compositions. For example, an additive polymer can be provided in addition to the matrix polymer and surface active polymer for purposes of tuning the resist feature profile and/or for controlling resist top loss. Additional polymers are typically miscible with the matrix polymer and substantially immiscible with the surface active polymer such that the surface active polymer can self-segregate from the other polymers to the topcoat surface away from the topcoat/photoresist interface.

Typical solvent materials to formulate and cast a topcoat composition are any which dissolve or disperse the components of the topcoat composition but do not appreciably dissolve an underlying photoresist layer. Preferably the total solvent is organic-based (i.e., greater than 50 wt % organic), typically from 90 to 100 wt %, more typically from 99 to 100 wt %, or 100 wt % organic solvent, not inclusive of residual water or other contaminants which may, for example, be present in an amount of from 0.05 to 1 wt %, based on the total solvent. Preferably, a mixture of different solvents, for example, two, three or more solvents, can be used to achieve effective phase separation of the segregating, surface active polymer from other polymer(s) in the composition. A solvent mixture can also be effective to reduce the viscosity of the formulation which allows for reduction in the dispense volume.

In an exemplary aspect, a two-solvent system or a three-solvent system can be used in the topcoat compositions of the invention. A preferred solvent system includes a primary solvent and an additive solvent, and may include a thinner solvent. The primary solvent typically exhibits excellent solubility characteristics with respect to the non-solvent components of the topcoat composition. While the desired boiling point of the primary solvent will depend on the other components of the solvent system, the boiling point is typically less than that of the additive solvent, with a boiling point of from 120 to 140° C. such as about 130° C. being typical. Suitable primary solvents include, for example, C4 to C10 monovalent alcohols, such as n-butanol, isobutanol, 2-methyl-1-butanol, isopentanol, 2,3-dimethyl-1-butanol, 4-methyl-2-pentanol, isohexanol, isoheptanol, 1-octanol, 1-nonanol and 1-decanol, and mixtures thereof. The primary solvent is typically present in an amount of from 30 to 80 wt % based on the solvent system.

The additive solvent can facilitate phase separation between the surface active polymer and other polymer(s) in the topcoat composition to facilitate a self-segregating topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers such as those of the following general formula (II):

wherein $R_5$ is an optionally substituted C1 to C2 alkyl group and $R_6$ and $R_7$ are independently chosen from optionally substituted C2 to C4 alkyl groups, and mixtures of such hydroxy alkyl ethers including isomeric mixtures. Exemplary hydroxy alkyl ethers include dialkyl glycol mono-alkyl ethers and isomers thereof, for example, diethylene glycol monomethyl ether, dipropylene glycol monomethyl ether, tripropylene glycol monomethyl ether, isomers thereof and mixtures thereof. The additive solvent is typically present in an amount of from 3 to 15 wt % based on the solvent system.

A thinner solvent can be used to lower the viscosity and improve coating coverage at a lower dispensing volume. The thinner solvent is typically a poorer solvent for the non-solvent components of the composition relative to the primary solvent. While the desired boiling point of the thinner solvent will depend on the other components of the solvent system, a boiling point of from 140 to 180° C. such as about 170° C. is typical. Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_{14}$—O—$R_{15}$, wherein $R_{14}$ and $R_{15}$ are independently chosen from C2 to C8 alkyl, C2 to C6 alkyl and C2 to C4 alkyl. The alkyl ether groups can be linear or branched, and symmetric or asymmetric. Particularly suitable alkyl ethers include, for example, isobutyl ether, isopentyl ether, isobutyl isohexyl ether, and mixtures thereof. Other suitable thinner solvents include ester solvents, for example, those represented by general formula (III):

wherein: $R_8$ and $R_9$ are independently chosen from C3 to C8 alkyl; and the total number of carbon atoms in $R_9$ and $R_9$ taken together is greater than 6. Suitable such ester solvents include, for example, propyl pentanoate, isopropyl pentanoate, isopropyl 3-methylbutanoate, isopropyl 2-methylbutanoate, isopropyl pivalate, isobutyl isobutyrate, 2-methylbutyl isobutyrate, 2-methylbutyl 2-methylbutanoate, 2-methylbutyl 2-methylhexanoate, 2-methylbutyl heptanoate, hexyl heptanoate, n-butyl n-butyrate, isoamyl n-butyrate and isoamyl isovalerate. The thinner solvent if used is typically present in an amount of from 10 to 70 wt % based on the solvent system.

A particularly preferred solvent system includes 4-methyl-2-pentanol, dipropylene glycol methyl ether and isobutyl isobutyrate. While the exemplary solvent system has been described with respect to two- and three-component systems, it should be clear that additional solvents may be used. For example, one or more additional primary solvents, thinner solvents, additive solvents and/or other solvents may be employed.

The topcoat compositions may comprise one or more other optional components. For example, the compositions can include one or more of actinic and contrast dyes for enhancing antireflective properties, anti-striation agents, and the like. Such optional additives if used are typically present in the composition in minor amounts such as from 0.1 to 10 wt % based on total solids of the topcoat composition.

It may be beneficial to include an acid generator compound such as a photoacid generator (PAG) and/or a thermal acid generator (TAG) compound in the topcoat compositions. Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable thermal acid generators include, for example, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, trifluoromethylbenzenesulfonic acid, perfluorobutane sulfonic acid; and particular onium salts. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Examples of TAGs include those sold by King Industries, Norwalk, Conn. USA under NACURE™, CDX™ and K-PURE™ names, for example, NACURE 5225, CDX-2168E, K-PURE™ 2678 and K-PURE™ 2700. One or more of such TAGs can be used.

If employed, the one or more acid generators may be utilized in relatively small amounts in a topcoat composition, for example, from 0.1 to 8 wt %, based on total solids of the composition. Such use of one or more acid generator compounds may favorably impact lithographic performance, particularly resolution, of the developed image patterned in an underlying resist layer.

Topcoat layers formed from the compositions typically have an index of refraction of 1.4 or greater at 193 nm, preferably 1.47 or greater at 193 nm. The index of refraction can be tuned by changing the composition of the matrix polymer, the surface active polymer, the additive polymer or other components of the overcoat composition. For example, increasing the relative amount of organic content in the overcoat composition may provide increased refractive index of the layer. Preferred overcoat composition layers will have a refractive index between that of the immersion fluid and the photoresist at the target exposure wavelength.

The photoresist topcoat compositions can be prepared following known procedures. For example, the compositions can be prepared by dissolving solid components of the composition in the solvent components. The desired total solids content of the compositions will depend on factors such as the particular polymers in the composition and desired final layer thickness. Preferably, the solids content of the overcoat compositions is from 1 to 10 wt %, more preferably from 1 to 5 wt %, based on the total weight of the composition. The viscosity of the entire composition is typically from 1.5 to 2 centipoise (cp).

Photoresist Compositions

Photoresist compositions useful in the methods of the invention include chemically-amplified photoresist compositions comprising a matrix polymer that is acid-sensitive, meaning that as part of a layer of the photoresist composition, the polymer and composition layer undergo a change in solubility in a developer as a result of reaction with acid generated by a photoacid generator following softbake, exposure to activating radiation and post exposure bake. The resist formulation can be positive-acting or negative-acting, but is typically positive-acting. In positive-type photoresists, the change in solubility is typically brought about when acid-labile groups such as photoacid-labile ester or acetal groups in the matrix polymer undergo a photoacid-promoted deprotection reaction on exposure to activating radiation and heat treatment. Suitable photoresist compositions useful for the invention are commercially available For imaging at wavelengths such as 193 nm, the matrix polymer is typically substantially free (e.g., less than 15 mole %) or completely free of phenyl, benzyl or other aromatic groups where such groups are highly absorbing of the radiation. Suitable polymers that are substantially or completely free of aromatic groups are disclosed in European application EP930542A1 and U.S. Pat. Nos. 6,692,888 and 6,680,159, all of the Shipley Company. Preferable acid-labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t-butyl acrylate, t-butyl methacrylate, methyladamantyl acrylate, methyladamantyl methacrylate, ethylfenchyl acrylate, ethylfenchyl methacrylate, and the like, and other non-cyclic alkyl and alicyclic (alkyl)acrylates. Such polymers have been described, for example, in U.S. Pat. No. 6,057,083, European Published Applications EP01008913A1 and EP00930542A1, and U.S. Pat. No. 6,136,501. Other suitable matrix polymers include, for example, those which contain polymerized units of a non-aromatic cyclic olefin (endocyclic double bond) such as an optionally substituted norbornene, for example, polymers described in U.S. Pat. Nos. 5,843,624 and 6,048,664. Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a heteroatom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable heteroatom group-containing matrix polymers include polymers that contain polymerized carbocyclic aryl units substituted with one or more heteroatom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions.

Suitable matrix polymers for use in the photoresist compositions are commercially available and can be readily made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoactive component such as a photoacid generator (PAG)

employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials. Suitable PAGs are known in the art of chemically amplified photoresists and include, for example, those described above with respect to the topcoat composition.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases are known in the art and include, for example, linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is suitably used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the solid components of the photoresist in the solvent component. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Lithographic Processing

Liquid photoresist compositions can be applied to a substrate such as by spin-coating, dipping, roller-coating or other conventional coating technique, with spin-coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in the methods of the invention are suitably applied to a substrate in a conventional manner for applying photoresists. For example, the compositions may be applied over silicon wafers or silicon wafers coated with one or more layers and having features on a surface for the production of microprocessors or other integrated circuit components. Aluminum-aluminum oxide, gallium arsenide, ceramic, quartz, copper, glass substrates and the like may also be suitably employed. The photoresist compositions are typically applied over an antireflective layer, for example, an organic antireflective layer.

A topcoat composition of the invention can be applied over the photoresist composition by any suitable method such as described above with reference to the photoresist compositions, with spin-coating being typical.

Following coating of the photoresist onto a surface, it may be heated (softbaked) to remove the solvent until typically the photoresist coating is tack free, or the photoresist layer may be dried after the topcoat composition has been applied and the solvent from both the photoresist composition and topcoat composition layers substantially removed in a single thermal treatment step.

The photoresist layer with overcoated topcoat layer is then exposed through a patterned photomask to radiation activating for the photoactive component of the photoresist. The exposure is typically conducted with an immersion scanner but can alternatively be conducted with a dry (non-immersion) exposure tool.

During the exposure step, the photoresist composition layer is exposed to patterned activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

The photoresist composition (and topcoat composition if photosensitive) is typically photoactivated by a short exposure wavelength, for example, radiation having a wavelength of less than 300 nm such as 248 nm, 193 nm and EUV wavelengths such as 13.5 nm. Following exposure, the layer of the composition is typically baked at a temperature ranging from about 70° C. to about 160° C.

Thereafter, the film is developed, typically by treatment with an aqueous base developer chosen, for example, from: quaternary ammonium hydroxide solutions such as a tetra-alkyl ammonium hydroxide solutions, typically a 0.26 N tetramethylammonium hydroxide; amine solutions such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist layer, the developed substrate may be selectively processed on those areas bared of resist, for example by chemically etching or plating substrate areas bared of resist in accordance with procedures known in the art. After such processing, the resist remaining on the substrate can be removed from the using known stripping procedures.

The following non-limiting examples are illustrative of the invention.

EXAMPLES

Molecular Weight Determination:

Number and weight-average molecular weights, Mn and Mw, and polydispersity (PDI) values (Mw/Mn) for the polymers were measured by gel permeation chromatography (GPC) on a Waters alliance system equipped with a refractive index detector. Samples were dissolved in HPLC grade THF at a concentration of approximately 1 mg/mL and injected through four Shodex columns (KF805, KF804, KF803 and KF802). A flow rate of 1 mL/min and temperature of 35° C. were maintained. The columns were calibrated with narrow molecular weight PS standards (EasiCal PS-2, Polymer Laboratories, Inc.).

Contact Angle Measurement

The topcoat compositions were coated on EPIC™ 2096 positive photoresist (Rohm and Haas Electronic Materials) to a thickness of 1100 Å and then baked at 90° C. for 60 seconds. Static contact angle (CA), receding CA, advancing CA and sliding angle with respect to DI water were measured for each sample. Static and dynamic contact angles were measured using a KRUSS drop shape analyzer model 100. For dynamic contact angle measurement, the droplet size of DI water was 50 μl (microliter), and the wafer stage tilting rate was 1 unit/sec. Once a water droplet was placed on a test wafer surface, the wafer stage started to tilt immediately. During wafer stage tilting, video of the droplet was taken at a rate of 20 frames per second until the droplet slid away from its original location. Each frame in the video was then analyzed, and the image of the droplet on the frame when the droplet just started to slide was used to determine the dynamic contact angles (receding and advancing) by their corresponding tangent lines. Sliding angle is the wafer stage tilting angle corresponding to the frame when the droplet just started to slide. In static contact angle measurement, water droplet was 2.5 μl and placed on the test wafer surface without tilting. The contact angle was determined by the tangent lines on both sides of the droplet. The reported static contact angle was the average of the contact angles from left and right sides of the droplet.

Resin Preparation:

The following monomers were used to prepare matrix polymers or surface active polymers as described below. Monomer ratios in the examples are provided on a weight percentage (wt %) basis of the polymer.

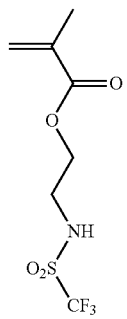

A1

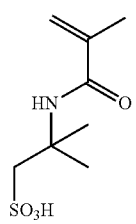

A2

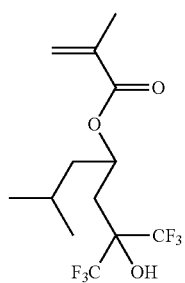

A3

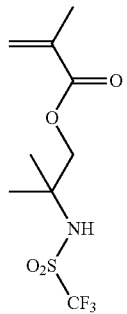

M1

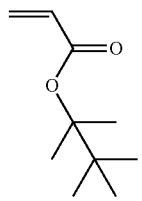

M2

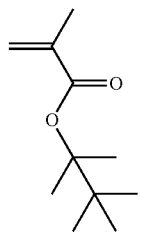

M3

M4

-continued

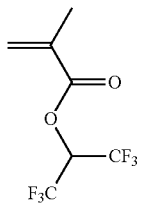
M5

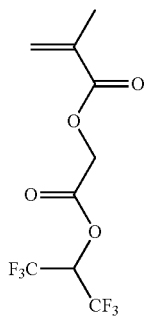
M6

Example 1—Matrix Polymer (MP1) Synthesis

Matrix Polymer (MP1) was prepared according to a process generally in accordance with that described below. The reaction vessel is charged with 55.0 g of 4-Methyl-2-pentanol and heated to 90° C. A monomer feed solution is prepared by combining 20.75 g 4-Methyl-2-pentanol, 81.0 g Monomer A1, and 9.0 g Monomer A2. An initiator feed is prepared by combining 30.82 g of 4-Methyl-2-pentanol and 3.42 g Vazo-67 initiator. The monomer feed solution and initiator feed solution are then introduced into the reaction vessel and fed over a period of two hours and three hours, respectively. The reaction vessel is maintained at 90° C. for an additional seven hours with agitation, and is then allowed to cool to room temperature to yield Matrix Polymer (MP1). [Mw=10.76 kDa, PDI=2.3].

Example 2—Matrix Polymer (MP2) Synthesis

Matrix Polymer (MP2) was prepared according to a process generally in accordance with that described below. The reaction vessel is charged with 32.53 g of Propylene glycol methyl ether and heated to 97° C. A monomer feed solution is prepared by combining 28.10 g Propylene glycol methyl ether, 31.17 g Monomer A2, and 3.28 g Monomer A3. An initiator feed is prepared by combining 4.43 g of Propylene glycol methyl ether and 0.49 g Vazo-67 initiator. The monomer feed solution and initiator feed solution are then introduced into the reaction vessel and fed over a period of two hours and three hours, respectively. The reaction vessel is maintained at 97° C. for an additional four hours with agitation, and is then allowed to cool to room temperature to yield Matrix Polymer (MP2). [Mw=17.06 kDa, PDI=2.42].

Example 3—Matrix Polymer (MP3) Synthesis

Matrix Polymer (MP3) was prepared according to a process generally in accordance with that described below. The reaction vessel is charged with 103.0 g of 4-Methyl-2-pentanol and heated to 90° C. A monomer feed solution is prepared by combining 54.25 g 4-Methyl-2-pentanol and 43.88 g Monomer A2. An initiator feed is prepared by combining 30.82 g of 4-Methyl-2-pentanol and 1.46 g Vazo-67 initiator. The monomer feed solution and initiator feed solution are then introduced into the reaction vessel and fed over a period of two hours and three hours, respectively. The reaction vessel is maintained at 90° C. for an additional seven hours with agitation, and is then allowed to cool to room temperature to yield Matrix Polymer (MP3). [Mw=12.28 kDa, PDI=2.36].

Compositional ratios as determined by $^1$H NMR (500 MHz), weight average molecular weight Mw and polydispersity (PDI=Mw/Mn) determined by the polystyrene equivalent value as measured by gel permeation chromatography (GPC) for the matrix polymers are shown in Table 1.

TABLE 1

| Example | Matrix Polymer | Monomers (wt %) | | | Mw (kDa) | PDI |
|---|---|---|---|---|---|---|
| | | A1 | A2 | A3 | | |
| 1 | MP1 | 90 | 10 | | 10.76/4.66 | 2.3 |
| 2 | MP2 | | 95 | 5 | 17.06/7.04 | 2.42 |
| 3 | MP3 | | 100 | | 12.28/5.21 | 2.36 |

Example 4—Surface Active Polymer (SAP1) Synthesis

A reaction vessel was charged with 30.0 g of Isobutyl-isobutyrate (IBIB) and heated to 99° C. A feed solution was prepared by combining 28.57 g of IBIB, 40.0 g Monomer M1 and 1.44 g Wako V-601 initiator. The feed solution was charged to the reaction vessel over a period of two hours and the reaction mixture was heated for an additional five hours. The reaction mixture was then allowed to cool to room temperature to yield Surface Active Polymer (SAP1). [Mw=6.55 kDa, PDI=1.6].

Example 5—Surface Active Polymer (SAP2) Synthesis

A reaction vessel was charged with 15.74 g of Propylene glycol monomethyl ether (PGME) and heated to 95° C. A feed solution was prepared by combining 15.33 g of PGME, 23.0 g Monomer M1 and 0.69 g Wako V-601 initiator. The feed solution was charged to the reaction vessel over a period of one hour, and the reaction mixture was heated for an additional 3.5 hours. The reaction mixture was then allowed to cool to room temperature. The polymer solution was precipitated in Methanol/H$_2$O 2:1 solvent blend to yield Surface Active Polymer (SAP2) as a white solid. [Mw=8.52 kDa, PDI=1.7].

Example 6—Surface Active Polymer (SAP3) Synthesis (Comparative)

A reaction vessel was charged with 25.0 g of Propylene glycol methyl ether acetate (PGMEA) and heated to 99° C. A feed solution was prepared by combining 23.2 g of PGMEA, 27.50 g Monomer M1, 12.50 g Monomer M2, 10.00 g Monomer M3, and 1.80 g Wako V-601 initiator. The feed solution was charged to the reaction vessel over a period of two hours, and the reaction mixture was heated for an additional two hours. The reaction mixture was then allowed to cool to room temperature to yield Surface Active Polymer (SAP3). [Mw=9.02 kDa, PDI=1.82].

Example 7—Surface Active Polymer (SAP4) Synthesis (Comparative)

A reaction vessel was charged with 12.54 g of PGMEA and heated to 95° C. A feed solution was prepared by combining 15.32 g of PGMEA, 11.53 g Monomer M1, 3.47 g Monomer M5, and 0.315 g Wako V-601 initiator. The feed solution was charged to the reaction vessel over a period of 1.5 hours, and the reaction mixture was heated for an additional three hours. The reaction mixture was then allowed to cool to room temperature. The polymer solution was precipitated in Methanol/H$_2$O 4:1 solvent blend to yield Surface Active Polymer (SAP4) as a white solid. [Mw=8.47 kDa, PDI=1.96].

Example 8—Surface Active Polymer (SAP5) Synthesis (Comparative) A reaction vessel was charged with 7.0 g of PGME and heated to 90° C. A feed solution was prepared by combining 6.6 g of PGME, 6.46 g Monomer M1, 3.54 g Monomer M4, and 0.21 g Wako V-601 initiator. The feed solution was charged to the reaction vessel over a period of 1.5 hours, and the reaction mixture was heated for an additional three hours. The reaction mixture was then allowed to cool to room temperature. The polymer solution was precipitated in Methanol/H$_2$O 4:1 solvent blend to yield Surface Active Polymer (SAP5) as a white solid. [Mw=14.06 kDa, PDI=1.79].

Example 9—Surface Active Polymer (SAP6) Synthesis (Comparative)

A reaction vessel was charged with 8.0 g of PGME and heated to 90° C. A feed solution was prepared by combining 5.6 g of PGME, 4.04 g Monomer M1, 2.43 g Monomer M5, 3.53 g Monomer M6 and 0.21 g Wako V-601 initiator. The feed solution was charged to the reaction vessel over a period of one hour, and the reaction mixture was heated for an additional four hours. The reaction mixture was then allowed to cool to room temperature. The polymer solution was precipitated in Methanol/H$_2$O 2:1 solvent blend to yield Surface Active Polymer (SAP6) as a white solid. [Mw=12.62 kDa, PDI=1.5].

Example 10—Surface Active Polymer (SAP7) Synthesis (Comparative)

A reaction vessel was charged with 7.0 g of PGME and heated to 90° C. A feed solution was prepared by combining 6.6 g of PGME, 4.26 g Monomer M1, 2.0 g Monomer M4, 3.73 g Monomer M6, and 0.21 g Wako V-601 initiator. The feed solution was charged to the reaction vessel over a period of 1.5 hours, and the reaction mixture was heated for an additional three hours. The reaction mixture was then allowed to cool to room temperature. The polymer solution was precipitated in Methanol/H$_2$O 2:1 solvent blend to yield Surface Active Polymer (SAP7) as a white solid. [Mw=12.95 kDa, PDI=1.9].

Example 11—Surface Active Polymer (SAP8) Synthesis (Comparative)

A reaction vessel was charged with 25.0 g of PGMEA and heated to 99° C. A feed solution was prepared by combining 23.7 g of PGMEA, 40.0 g Monomer M1, 10.0 g Monomer M3, and 1.30 g Wako V-601 initiator. The feed solution was charged to the reaction vessel over a period of two hours, and the reaction mixture was heated for an additional two hours. The reaction mixture was then allowed to cool to room temperature to yield Surface Active Polymer SAP8 as a white solid. [Mw=10.87 kDa, PDI=2.08].

Compositional ratios as determined by $^1$H NMR (500 MHz), weight average molecular weight Mw and polydispersity (PDI=Mw/Mn) determined by the polystyrene equivalent value as measured by gel permeation chromatography (GPC) for the surface active polymers are shown in Table 2.

TABLE 2

| Example | Surface Active Polymer | Monomers (wt %) | | | | | | Mw (kDa) | PDI |
|---|---|---|---|---|---|---|---|---|---|
| | | M1 | M2 | M3 | M4 | M5 | M6 | | |
| 4 | SAP1 | 100 | | | | | | 6.55 | 1.6 |
| 5 | SAP2 | 100 | | | | | | 8.52 | 1.7 |
| 6 (Comp) | SAP3 | 55 | 25 | 20 | | | | 9.02 | 1.82 |
| 7 (Comp) | SAP4 | 77 | | | | 23 | | 8.47 | 1.96 |
| 8 (Comp) | SAP5 | 65 | | | 35 | | | 14.06 | 1.79 |
| 9 (Comp) | SAP6 | 40 | | | | 25 | 35 | 12.62 | 1.5 |
| 10 (Comp) | SAP7 | 42 | | | 20 | | 38 | 12.95 | 1.9 |
| 11 (Comp) | SAP8 | 80 | | 20 | | | | 10.87 | 2.08 |

Topcoat Composition Preparation:

Topcoat compositions were formulated by adding solid components to a solvent system in the amounts shown in Table 3. Each mixture was filtered through a 0.2 μm PTFE disk.

TABLE 3

| Example | Topcoat Composition | Matrix A | Matrix B | SAP | PAG-1 | Solvent System | | | |
|---|---|---|---|---|---|---|---|---|---|
| 12 | TC1 | MP1 | MP2 | SAP1 | 0.010 | S1 | S2 | S3 | S4 |
| | | 1.075 | 0.717 | 0.245 | | 51.533 | 39.888 | 5.983 | 0.55 |
| 13 | TC2 | MP1 | MP2 | SAP2 | 0.010 | S1 | S2 | S3 | |
| | | 1.077 | 0.718 | 0.245 | | 51.822 | 40.111 | 6.017 | |
| 14 (Comp) | TC3 | MP1 | MP2 | SAP3 | 0.010 | S1 | S2 | S3 | S5 |
| | | 1.088 | 0.725 | 0.247 | | 51.648 | 40.005 | 6.001 | 0.241 |
| 15 (Comp) | TC4 | MP1 | MP2 | SAP4 | 0.010 | S1 | S2 | S3 | |
| | | 1.077 | 0.718 | 0.245 | | 51.822 | 40.111 | 6.017 | |
| 16 (Comp) | TC5 | MP1 | MP2 | SAP5 | 0.010 | S1 | S2 | S3 | |
| | | 1.077 | 0.718 | 0.245 | | 51.822 | 40.111 | 6.017 | |
| 17 (Comp) | TC6 | MP1 | MP3 | SAP6 | 0.010 | S1 | S2 | S3 | |
| | | 1.082 | 0.722 | 0.246 | | 51.817 | 40.107 | 6.016 | |

TABLE 3-continued

| Example | Topcoat Composition | Matrix A | Matrix B | SAP | PAG-1 | Solvent System | | | |
|---|---|---|---|---|---|---|---|---|---|
| 18 (Comp) | TC7 | MP1 1.082 | MP3 0.722 | SAP7 0.246 | 0.010 | S1 51.817 | S2 40.107 | S3 6.016 | |
| 19 (Comp) | TC8 | MP1 1.077 | MP2 0.718 | SAP8 0.245 | 0.010 | S1 55.461 | S2 39.811 | S5 0.734 | S6 1.944 |

Comp = Comparative; S1 = 4-Methyl-2-Pentanol; S2 = Isoamyl ether; S3 = Dipropylene Glycol Methyl Ether.; S4 = isobutyl isobutyrate; S5 = Propylene glycol methyl ether acetate; S6 = Tripopylene Glycol Methyl Ether; all values in grams (g).

PAG-1

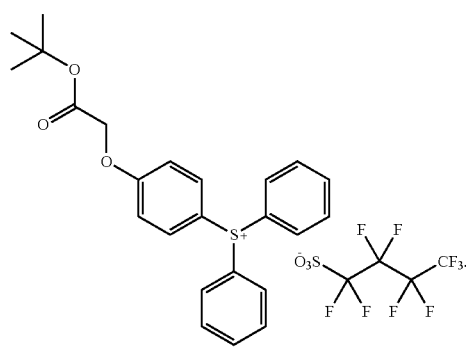

Coating Defect Testing Procedure:

Coating defect testing was carried out by coating topcoat compositions with a TEL Lithius wafer track on 300 mm bare silicon wafers. The compositions were coated to a thickness of 385 Å using a dispense time of 2.6 seconds and a softbake at 90° C. for 60 seconds. The coated topcoat layers were inspected on a KLA-Tencor Surfscan SP2 wafer surface inspection tool for detection of particles of 60 nm and larger. The results are shown in Table 4.

Pattern Defect Testing:

300 mm bare silicon wafers were coated on a TEL Lithius 300 mm wafer track with AR™ 40A bottom antireflective coating (BARC) material (The Dow Chemical Company) and cured at 205° C. for 60 seconds to form an 800 Å first BARC layer. AR™ 104 BARC material (The Dow Chemical Company) was coated over the first BARC layer and cured at 205° C. for 60 seconds to form a 400 Å second BARC layer. EPIC™ 2099 photoresist was coated over the BARC layer stack and softbaked at 95° C. for 60 seconds to form a 950 Å photoresist layer. The topcoat compositions shown in Table 4 were coated over the photoresist layer and softbaked at 90° C. for 60 seconds to form a 385 Å topcoat layer. The wafers were exposed on an ASML 1900i immersion scanner at 1.35 NA, 0.85/0.75 inner/outer sigma, dipole 35Y illumination with X-polarization, through a photomask to form a 45 nm 1:1 line/space pattern. The wafers were post-exposure baked (PEB) at 95° C. for 60 seconds. The wafers were developed with 0.26 N aqueous TMAH developer, rinsed with distilled water, and spun-dry to form photoresist patterns. The patterned wafers were inspected on a KLA-Tencor 2800 defect inspection tool for pattern defects. The results of the defect analysis are provided in Table 4.

TABLE 4

| Example | TC Formulation | Surface Active Polymer | RCA (°) | Pattern Defect Density (defects/cm$^2$) | Coating Defect Density (defects/cm$^2$) |
|---|---|---|---|---|---|
| 20 | TC1 | SAP 1 | 87.3 | 0.18 | 0.03 |
| 21 | TC2 | SAP 2 | 87.1 | 0.17 | 0.05 |
| 22 (Comp) | TC3 | SAP 3 | 74.9 | 0.2 | 0.25 |
| 23 (Comp) | TC4 | SAP 4 | 90 | 1.12 | 0.03 |
| 24 (Comp) | TC5 | SAP 5 | 84.8 | 0.61 | 0.09 |
| 25 (Comp) | TC6 | SAP 6 | 88.27 | 0.45 | 0.93 |
| 26 (Comp) | TC7 | SAP 7 | 87.96 | 0.24 | 0.38 |
| 27 (Comp) | TC8 | SAP 8 | 82 | 0.8 | 0.1 |

What is claimed is:

1. A photoresist topcoat composition, comprising:
a matrix polymer;
a surface active polymer, wherein the surface active polymer comprises polymerized units of the following general formula (I):

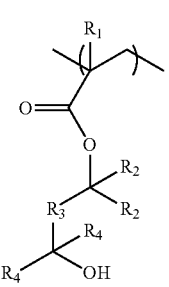

wherein: $R_1$ represents a hydrogen atom, a halogen atom, a C1-C4 alkyl group, or a C1-C4 haloalkyl group; $R_2$ independently represents a hydrogen atom or an optionally substituted alkyl group, wherein at least one $R_2$ is not a hydrogen atom, wherein the $R_2$ groups taken together optionally form a cyclic structure, and wherein the total number of carbon atoms for the $R_2$ groups taken together is from 2 to 20; $R_3$ represents an optionally substituted C1-C4 alkylene group, and an $R_2$ group optionally forms a cyclic structure with $R_3$; and $R_4$ independently represents C1-C4 fluoroalkyl groups;

wherein the total polymerized units of general formula (I) are present in the surface active polymer in an amount of 95 wt % or more based on total polymerized units of the surface active polymer; and wherein the surface active polymer is present in the composition in an amount of from 0.1 to 30 wt % based on total solids of the composition;

an acid generator compound; and an organic-based solvent system comprising a plurality of organic solvents.

2. The photoresist topcoat composition of claim 1, wherein total polymerized units of general formula (I) are present in the surface active polymer in an amount of 100 wt % based on total polymerized units of the surface active polymer.

3. The photoresist topcoat composition of claim 1, wherein the surface active polymer is a homopolymer.

4. The photoresist topcoat composition of claim 1, wherein at least one $R_2$ is an optionally substituted branched C3-C12 alkyl group.

5. The photoresist topcoat composition of claim 1, wherein the $R_2$ groups taken together form a cyclic structure.

6. The photoresist topcoat composition of claim 1, wherein $R_4$ is a trifluoromethyl group.

7. The photoresist topcoat composition of claim 1, further comprising an additive polymer that is different from the matrix polymer and the surface active polymer.

8. A coated substrate, comprising:

a photoresist layer on a substrate; and a topcoat layer formed from a photoresist topcoat composition of claim 1 on the photoresist layer.

9. A method of processing a photoresist composition, comprising:

(a) applying a photoresist composition over a substrate to form a photoresist layer;

(b) applying over the photoresist layer a photoresist topcoat composition to form a topcoat layer, wherein the photoresist topcoat composition, comprises:

a matrix polymer;

a surface active polymer, wherein the surface active polymer comprises:

polymerized units of the following general formula (I):

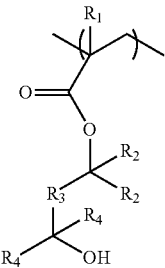

(I)

wherein: $R_1$ represents a hydrogen atom, a halogen atom, a C1-C4 alkyl group, or a C1-C4 haloalkyl group; $R_2$ independently represents a hydrogen atom or an optionally substituted alkyl group, wherein at least one $R_2$ is not a hydrogen atom, wherein the $R_2$ groups taken together optionally form a cyclic structure, and wherein the total number of carbon atoms for the $R_2$ groups taken together is from 2 to 20; $R_3$ represents an optionally substituted C1-C4 alkylene group, and an $R_2$ group optionally forms a cyclic structure with $R_3$; and $R_4$ independently represents C1-C4 fluoroalkyl groups;

wherein the total polymerized units of general formula (I) are present in the surface active polymer in an amount of 95 wt % or more based on total polymerized units of the surface active polymer; and wherein the surface active polymer is present in the composition in an amount of from 0.1 to 30 wt % based on total solids of the composition; and an organic-based solvent system comprising a plurality of organic solvents;

(c) exposing the topcoat layer and the photoresist layer to activating radiation; and (d) contacting the exposed topcoat layer and photoresist layer with an aqueous base developer to form a resist pattern.

10. The method of claim 9, wherein the topcoat layer is formed by spin-coating, and the surface active polymer migrates to an upper surface of the topcoat layer during the spin-coating, wherein an upper surface of the topcoat layer consists essentially of the surface active polymer.

11. The method of claim 9, wherein total polymerized units of general formula (I) are present in the surface active polymer in an amount of 100 wt % based on total polymerized units of the surface active polymer.

12. The method of claim 9, wherein the surface active polymer is a homopolymer.

13. The method of claim 9, wherein at least one $R_2$ is an optionally substituted branched C3-C12 alkyl group.

14. The method of claim 9, wherein the $R_2$ groups taken together form a cyclic structure.

15. The method of claim 9, wherein $R_4$ is a trifluoromethyl group.

16. The method of claim 9, further comprising an additive polymer that is different from the matrix polymer and the surface active polymer.

* * * * *